(12) United States Patent
Park et al.

(10) Patent No.: US 8,367,550 B2
(45) Date of Patent: Feb. 5, 2013

(54) FABRICATING LOW CONTACT RESISTANCE CONDUCTIVE LAYER IN SEMICONDUCTOR DEVICE

(75) Inventors: Jong Bum Park, Seoul (KR); Chun Ho Kang, Icheon-si (KR); Young Seung Kim, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 12/978,832

(22) Filed: Dec. 27, 2010

(65) Prior Publication Data

US 2011/0159676 A1    Jun. 30, 2011

(30) Foreign Application Priority Data

Dec. 30, 2009  (KR) .................. 10-2009-0134670

(51) Int. Cl.
*H01L 21/44* (2006.01)

(52) U.S. Cl. .......... 438/684; 438/594; 438/57; 438/792; 117/8; 427/569; 432/247; 257/751; 219/390

(58) Field of Classification Search .......... 438/584, 438/57, 684, 792; 117/8; 219/390; 257/751; 427/569; 432/247
See application file for complete search history.

(56) References Cited

U.S. PATENT DOCUMENTS

| | | | |
|---|---|---|---|
| 5,194,397 A * | 3/1993 | Cook et al. .................. 438/684 |
| 5,527,392 A | 6/1996 | Snail et al. |
| 5,907,188 A * | 5/1999 | Nakajima et al. ............. 257/751 |
| 6,093,243 A * | 7/2000 | Okada et al. ...................... 117/8 |
| 7,413,767 B2 | 8/2008 | Bauch et al. |
| 8,052,419 B1 * | 11/2011 | Nordin et al. ................. 432/247 |
| 2002/0096507 A1 * | 7/2002 | Nishitani et al. .............. 219/390 |
| 2006/0029747 A1 * | 2/2006 | Cruse et al. ................... 427/569 |
| 2007/0037413 A1 * | 2/2007 | Ishihara et al. ............... 438/792 |
| 2009/0029502 A1 * | 1/2009 | Choi et al. ....................... 438/57 |

FOREIGN PATENT DOCUMENTS

| | | |
|---|---|---|
| JP | 09-055480 | 2/1997 |
| KR | 1020040025967 A | 3/2004 |

* cited by examiner

*Primary Examiner* — Thao Le
*Assistant Examiner* — Eric Jones
(74) *Attorney, Agent, or Firm* — William Park & Associates Ltd.

(57) ABSTRACT

A conductive layer may be fabricated on a semiconductor substrate by loading a silicon substrate in to a chamber whose inside temperature is at a loading temperature in the range of approximately 250° C. to approximately 300° C., increasing the inside temperature of the chamber from the loading temperature to a process temperature, and sequentially stacking a single crystalline silicon layer and a polycrystalline silicon layer over the silicon substrate by supplying a silicon source gas and an impurity source gas in to the chamber, where the chamber may be, for example, a CVD chamber or a LPCVD chamber.

14 Claims, 7 Drawing Sheets

FABRICATING LOW CONTACT RESISTANCE CONDUCTIVE LAYER IN SEMICONDUCTOR DEVICE

CROSS-REFERENCES TO RELATED APPLICATIONS

The present application claims priority under 35 U.S.C 119(a) to Korean application number 10-2009-0134670 filed on Dec. 30, 2009 in the Korean intellectual property Office, which is incorporated herein by reference in its entirety.

BACKGROUND

Exemplary embodiments of the present invention relate to fabricating a conductive layer in a semiconductor device, and more particularly to fabricating a conductive layer having a low contact resistance in a semiconductor device using a chemical vapor deposition (CVD) process.

In a semiconductor device, active elements are disposed over a silicon substrate, and, if necessary, passive elements such as capacitors are also disposed over the silicon substrate together with the active elements. Electric connection paths for signal transfers may be required between two elements where each element may be active or passive. Typically, the electrical connection paths are formed by disposing conductive layers between the elements in a contact structure.

FIG. 1 is a cross-sectional view of landing plug contacts in a semiconductor device. Referring to FIG. 1, device isolation layers 102 define an active region in a silicon substrate 100, and impurity regions 112 and 114 are disposed within the active region. Each area between the impurity regions 112 and 114 defines a channel region where a channel is formed under a predetermined condition. A gate stack 120 is disposed over each channel region. The gate stack 120 includes a gate dielectric layer 121, a gate conductive layer 122, and a gate hard mask layer 123. A gate spacer layer 130 is formed at each sidewall of the gate stack 120. Landing plug contacts 142 and 144 are formed over the impurity regions 112 and 114 which are exposed by the gate stack 120 and the gate spacer layers 130. The landing plug contacts 142 and 144 are conductive layers that are coupled to a storage node contact and a bit line contact in order that the landing plug contacts 142 and 144 are coupled to a capacitor and a bit line, respectively. In FIG. 1, the landing plug contact 142 is coupled to the bit line contact, and the land plug contact 144 is coupled to the storage node contact.

The landing plug contacts 142 and 144 are usually formed using polycrystalline silicon because of its sufficient conductivity. A chemical vapor deposition (CVD) process, and in particular, a low pressure CVD (LPCVD) process is commonly used to form the landing plug contacts 142 and 144.

FIG. 2 is a graph of temperature inside a chamber during a LPCVD process of forming a conductive polycrystalline silicon layer. In FIG. 2, line 210 shows an inside temperature of an LPCVD chamber. A silicon substrate 100 is loaded in to an LPCVD chamber during a loading period t1 when a loading temperature A1 is maintained. The loading temperature A1 may be, for example, approximately 400° C.

The inside temperature of the chamber is increased to a process temperature A2 during a temperature rise period t2. After the inside temperature of the chamber is increased to the process temperature A2, the chamber temperature is maintained at temperature A2 during a temperature stabilization period t3. After the temperature stabilization period t3, a source gas such as, for example, silane ($SiH_4$), is supplied in to the chamber together with an impurity source gas such as, for example, phosphine ($PH_3$). When these source gases are supplied into the chamber, silicon nuclei may form on the silicon substrate, and coalescing may occur around the silicon nuclei to thereby form a polycrystalline silicon layer.

In the above conventional process, the loading temperature A1 of the chamber is set to a temperature of approximately 400° C. However, during the loading period t1, an undesirable natural oxide layer may form on the surface of the silicon substrate to a thickness, for example, of approximately 1 Å. The natural oxide layer may increase the resistance of the landing plug contacts 142 and 144 formed by deposition of the polycrystalline silicon layer.

SUMMARY

An embodiment of the present invention relates to fabricating a conductive layer in a semiconductor device with reduced total resistance of the conductive layer. This may be accomplished in an existing chamber, such as, for example, a CVD chamber or a LPCVD chamber, by reducing a thickness of a natural oxide layer and by forming the conductive layer in a stacked structure including a single crystalline silicon layer and a polycrystalline silicon layer.

Various embodiments of the invention may describe a first layer as being "over" or "on" a second layer. These terms may mean that the first layer is directly on top of the second layer, or that there may be at least one other layer between the first layer and the second layer.

In one embodiment, a method of fabricating a conductive layer in a semiconductor substrate may include: loading a silicon substrate in to a chamber whose inside temperature is at a loading temperature in the range of approximately 250° C. to approximately 300° C.; increasing the inside temperature of the chamber from the loading temperature to a process temperature; and sequentially stacking a single crystalline silicon layer and a polycrystalline silicon layer over the silicon substrate by supplying a silicon source gas and an impurity source gas in to the chamber, where the chamber may be, for example, a CVD chamber or a LPCVD chamber.

The process temperature may be in a range of approximately 500° C. to approximately 550° C. The silicon source gas may be, for example, silane ($SiH_4$) and the impurity source gas may be, for example, phosphine ($PH_3$) The inside temperature of the chamber may be increased in a substantially linear manner from the loading temperature to the process temperature.

Furthermore, in some embodiments of the invention, the silicon source gas and the impurity source gas may be supplied to the chamber at substantially the same time. Additionally, the silicon source gas and the impurity source gas may be supplied to the chamber when the inside temperature of the chamber is between substantially the loading temperature and substantially the process temperature.

Various embodiments of the invention may also supply the silicon source gas to the chamber when the inside temperature of the chamber is between substantially the loading temperature and substantially the process temperature, and the silicon source gas and the impurity source gas may be supplied to the chamber at substantially the same time when the inside temperature of the chamber is substantially at the process temperature.

BRIEF DESCRIPTION OF THE DRAWINGS

The above and other aspects, features and other advantages will be more clearly understood from the following detailed description taken in conjunction with the accompanying drawings, in which.

DESCRIPTION OF SPECIFIC EMBODIMENTS

Hereinafter, specific embodiments of the present invention will be described with reference to the accompanying drawings. The drawings are not necessarily to scale and in some instances, proportions may have been exaggerated in order to clearly depict certain features of an embodiment of the invention.

Figure 3:
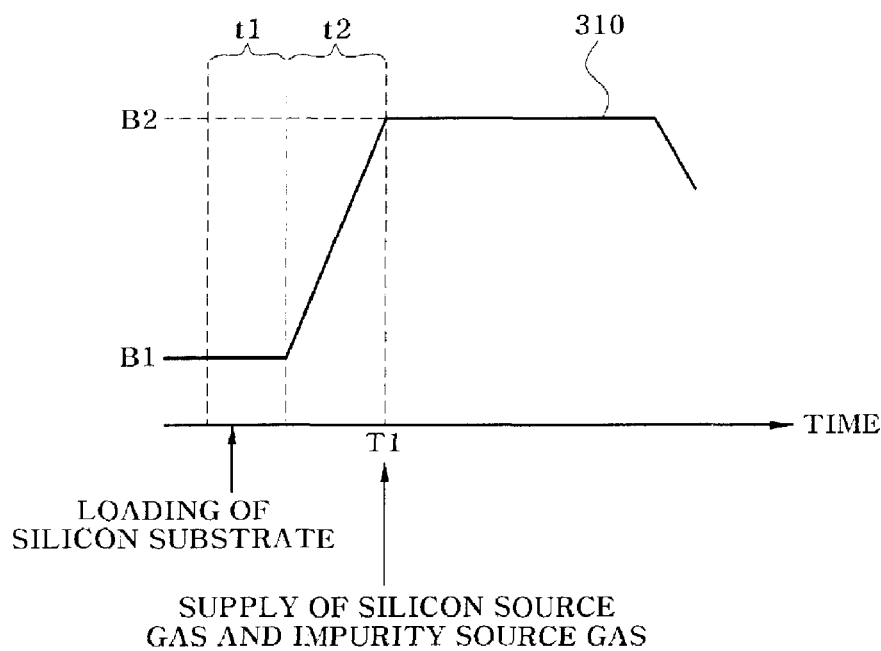
FIG. 3 is a graph of temperature inside a chamber during fabrication of a conductive layer in a semiconductor device according to an embodiment of the present invention.

FIG. 3 is a graph of temperature inside a chamber during fabrication of a conductive layer in a semiconductor device according to an embodiment of the present invention. In FIG. 3, line 310 represents inside temperature of a chamber. Referring to FIG. 3, a substrate, for example, a silicon substrate, is loaded into the chamber during a loading period t1 during which the chamber is maintained at a loading temperature B1. The loading temperature B1 may be, for example, in the range of approximately 250° C. to approximately 300° C. At this loading temperature for B1, a natural oxide layer may form on the surface of the silicon substrate to a thickness of 0.5 Å or less, and more specifically, for example, to a thickness of approximately 0.1 Å to approximately 0.3 Å.

After the silicon substrate is loaded into the chamber, the inside temperature of the chamber may be increased from the loading temperature B1 to a process temperature B2. The temperature increase from the loading temperature B1 to the process temperature B2 may be, for example, substantially linear. Accordingly, the process temperature B2 may be reached at a predetermined time T1 where the process temperature B2 may be, for example, in the range of approximately 500° C. to approximately 550° C.

At time T1, a silicon source gas such as, for example, silane (SiH$_4$), may be supplied in to the chamber. An impurity source gas for an impurity ion doping such as, for example, phosphine (PH$_3$), may also be supplied in to the chamber together with the silicon source gas.

When the source gases are supplied into the chamber at or after time T1 when the inside temperature of the chamber reaches the process temperature B2 of approximately 500° C. to approximately 550° C., silicon may be grown on the silicon substrate in a single crystalline structure along a crystal of the silicon substrate without nucleus formation. Accordingly, a single crystalline silicon layer may be deposited on the surface of the silicon substrate. The single crystalline silicon layer may be easily formed because the thickness of the natural oxide layer over the silicon substrate may be 0.5 Å or less.

While the process of depositing the single crystalline silicon layer over the silicon substrate is in progress, silicon nuclei may form on the single crystalline silicon layer after a period of time that may be, for example, predetermined. Coalescing may then occur around the silicon nuclei to form a polycrystalline silicon layer. Accordingly, a conductive layer in which the single crystalline silicon layer and the polycrystalline silicon layer are sequentially stacked over the silicon substrate may be obtained.

Figure 4:
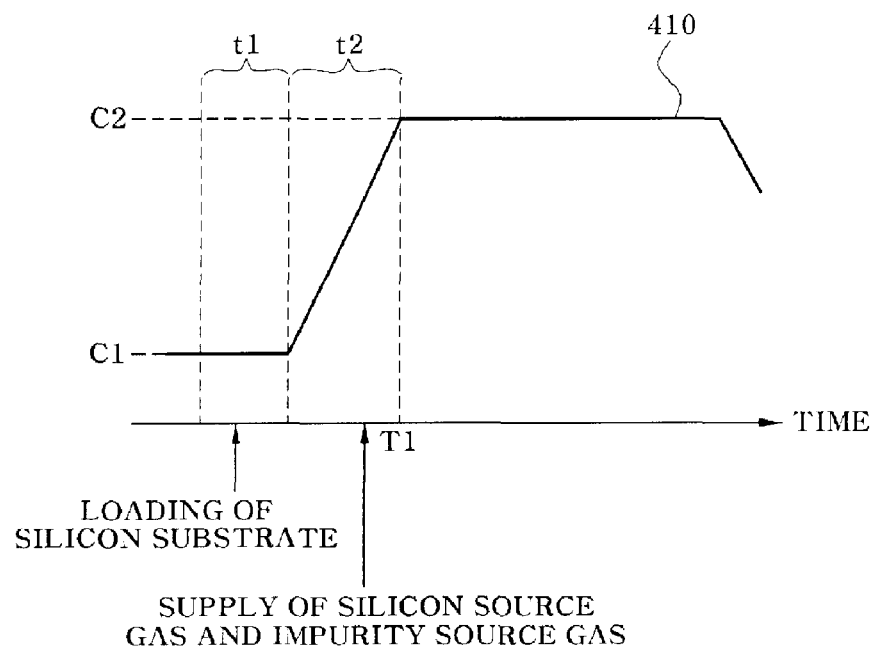
FIG. 4 is a graph of temperature inside a chamber during fabrication of a conductive layer in a semiconductor device according to an embodiment of the present invention.

FIG. 4 is a graph of temperature inside a chamber during fabrication of a conductive layer in a semiconductor device according to an embodiment of the present invention. In FIG. 4, line 410 shows inside temperature of a chamber. Referring to FIG. 4, a substrate, for example, a silicon substrate, is loaded into the chamber within a loading period t1 at a loading temperature C1, where the loading temperature C1 may be, for example, in the range of approximately 250° C. to approximately 300° C. By setting the loading temperature C1 in the range of approximately 250° C. to approximately 300° C., a natural oxide layer can form on the surface of the silicon substrate to a thickness, for example, of 0.5 Å or less, and more specifically, to a thickness, for example, from approximately 0.1 Å to approximately 0.3 Å.

After the silicon substrate is loaded into the chamber, the inside temperature of the chamber may be increased from the loading temperature C1 to a process temperature C2. During this temperature rise period t2, the inside temperature of the chamber may increase, for example, substantially linearly from the loading temperature C1 to the process temperature C2. Accordingly, the process temperature C2 may be reached at a time T1 that may be, for example, predetermined. The process temperature C2 may be in the range of, for example, approximately 500° C. to approximately 550° C. Before the time T1 when the inside temperature of the chamber reaches the process temperature C2, a silicon source gas such as, for example, silane (SiH$_4$), may be supplied into the chamber. An impurity source gas for an impurity ion doping such as, for example, phosphine (PH$_3$), may also be supplied into the chamber together with the silicon source gas.

As such, by supplying the source gases into the chamber before the time when the inside temperature of the chamber reaches the process temperature C2 of approximately 500° C. to approximately 550° C., silicon may be well grown on the silicon substrate in a single crystalline structure along a crystal of the silicon substrate, without nucleus formation. In this embodiment, the single crystalline silicon layer may also be easily formed because the thickness of the natural oxide layer over the silicon substrate may be 0.5 Å or less. When a time period, which may be predetermined, elapses while the process of depositing the single crystalline silicon layer over the silicon substrate is in progress, silicon nuclei may form on the single crystalline silicon layer. Coalescing may occur around the silicon nuclei to form a polycrystalline silicon layer. Accordingly, a conductive layer in which the single crystalline silicon layer and the polycrystalline silicon layer are sequentially stacked over the silicon substrate may be obtained.

Figure 5:
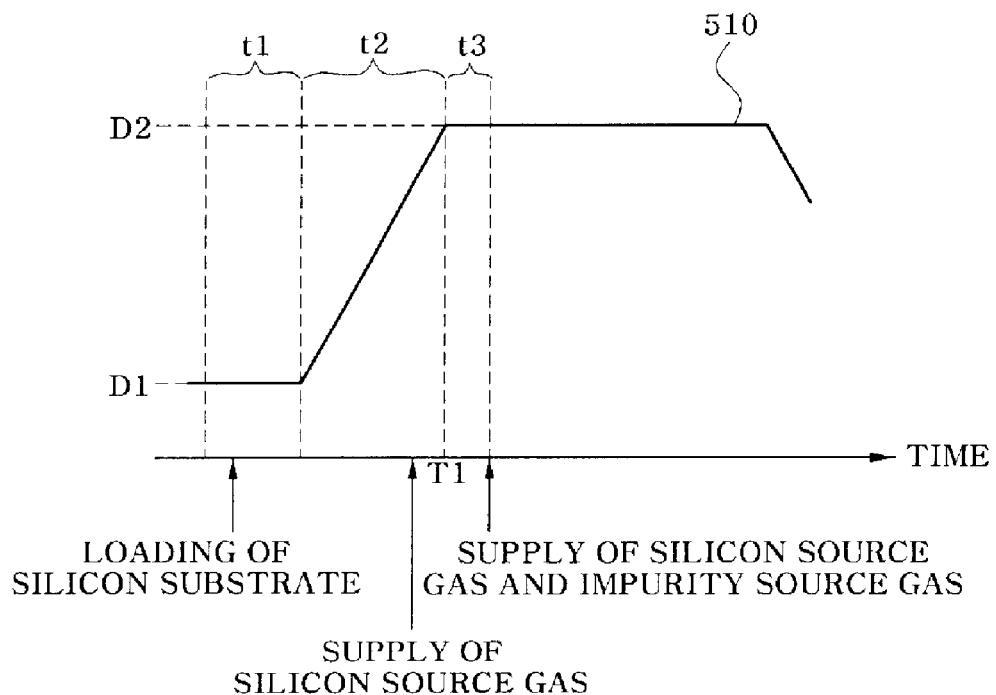
FIG. 5 is a graph of temperature inside a chamber during fabrication of a conductive layer in a semiconductor device according to an embodiment of the present invention.

FIG. 5 is a graph of temperature inside a chamber during fabrication of a conductive layer in a semiconductor device according to an embodiment of the present invention. In FIG. 5, line 510 shows inside temperature of a chamber. Referring to FIG. 5, a substrate, for example, a silicon substrate, is loaded into the chamber within a loading period t1 during which a loading temperature D1 is maintained. The loading temperature D1 may be in the range, for example, of approximately 250° C. to approximately 300° C. By setting the loading temperature D1 in the range of approximately 250° C. to approximately 300° C., a natural oxide layer may form on the surface of the silicon substrate to a thickness, for example, of 0.5 Å or less, more specifically to a thickness, for example, of approximately 0.1 Å to 0.3 Å.

After the silicon substrate is loaded into the chamber, the inside temperature of the chamber may be increased from the loading temperature D1 to a process temperature D2. During this temperature rise period t2, the inside temperature of the chamber may increase, for example, substantially linearly from the loading temperature D1 to the process temperature D2 and then reaches the process temperature D2 at, for example, a predetermine time T1. The process temperature D2 may be, for example, in the range of approximately 500° C. to approximately 550° C. Before the time T1 when the inside temperature of the chamber reaches the process temperature D2, a silicon source gas such as, for example, silane ($SiH_4$), may be supplied into the chamber. At this time, an impurity source gas for an impurity ion doping such as, for example, phosphine ($PH_3$), is not supplied into the chamber. As such, by supplying the source gas into the chamber before the time when the inside temperature of the chamber reaches the process temperature D2 of approximately 500° C. to approximately 550° C., silicon may be well grown on the silicon substrate in a single crystalline structure along a crystal of the silicon substrate, without nucleus formation. Furthermore, in this embodiment, the single crystalline silicon layer may form more easily because the thickness of a natural oxide layer over the silicon substrate is 0.5 Å or less.

During the process of growing the single crystalline silicon layer by supplying the silicon source gas into the chamber, the inside of the chamber may be increased up to the process temperature D2 at the time T1, which may be, for example, predetermined, and then, the process temperature D2 is constantly maintained. In this embodiment, when a temperature stabilization period t3 elapses after the inside temperature of the chamber reaches the process temperature D2, a silicon source gas and an impurity source gas may be supplied together into the chamber. Silicon nuclei may form on the single crystalline silicon layer, and coalescing nay occur around the silicon nuclei to thereby form a polycrystalline silicon layer. Accordingly, a conductive layer in which the single crystalline silicon layer and the polycrystalline silicon layer are sequentially stacked over the silicon substrate may be obtained.

Figure 6:
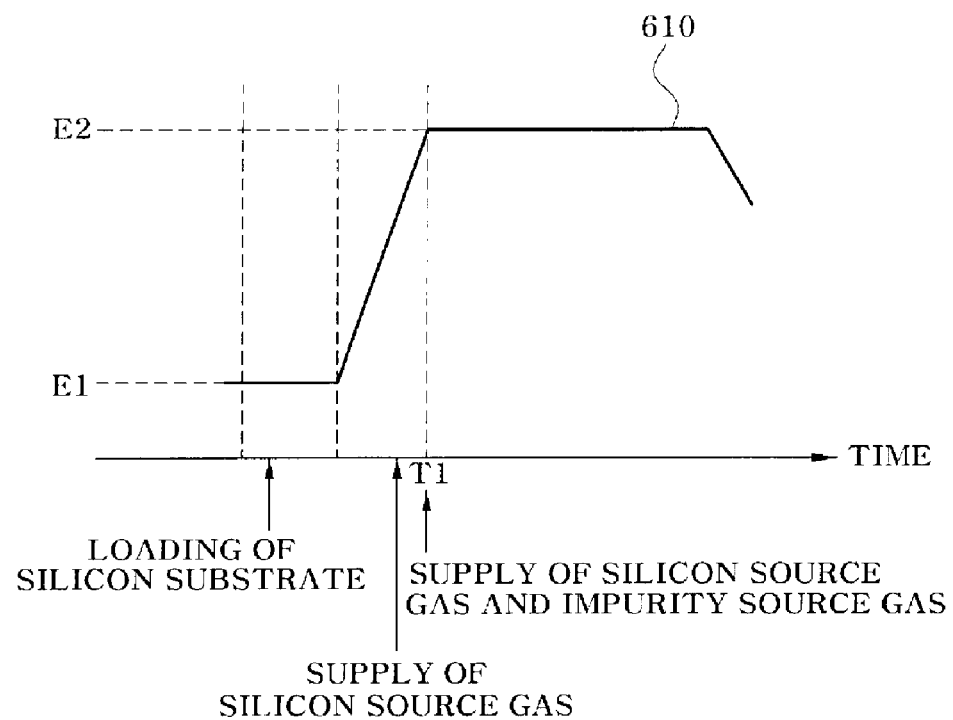
FIG. 6 is a graph of temperature inside a chamber during fabrication of a conductive layer in a semiconductor device according to an embodiment of the present invention.

FIG. 6 is a graph of temperature inside a chamber during fabrication of a conductive layer in a semiconductor device according to an embodiment of the present invention. In FIG. 6, line 610 may show inside temperature of a chamber. Referring to FIG. 6, a substrate, for example, a silicon substrate, is loaded into a chamber within a loading period t1 during which a loading temperature E1 is maintained. The loading temperature E1 within the loading period t1 during which the silicon substrate is loaded may be in the range, for example, of approximately 250° C. to approximately 300° C. By setting the loading temperature E1 in the range of approximately 250° C. to approximately 300° C., a natural oxide layer may form on the surface of the silicon substrate to a thickness, for example, of 0.5 Å or less, more specifically to a thickness, for example, of approximately 0.1 Å to 0.3 Å.

After the silicon substrate is loaded into the chamber, the inside temperature of the chamber may be increased from the loading temperature E1 to a process temperature E2. During this temperature rise period t2, the inside temperature of the chamber may be increased, for example, substantially linearly from the loading temperature E1 to the process temperature E2. Accordingly, the process temperature E2 may be reached at a time T1, which may be, for example, predetermined. The process temperature E2 may be, for example, in the range of approximately 500° C. to approximately 550° C. Before the time T1 when the inside temperature of the chamber reaches the process temperature E2, a silicon source gas such as, for example, silane ($SiH_4$), may be supplied into the chamber. At this time, an impurity source gas for an impurity ion doping such as, for example, phosphine ($PH_3$), is not supplied into the chamber. As such, by supplying the source gas into the chamber before the time when the inside temperature of the chamber reaches the process temperature E2 of approximately 500° C. to approximately 550° C., silicon may be well grown on the silicon substrate in a single crystalline structure along a crystal of the silicon substrate, without nucleus formation. Furthermore, in this embodiment, the single crystalline silicon layer may form more easily because the thickness of a natural oxide layer over the silicon substrate is 0.5 Å or less.

During the process of growing the single crystalline silicon layer by supplying the silicon source gas into the chamber, the temperature inside the chamber may be increased up to the process temperature E2 at the time T1, which may be, for example, predetermined, and then, the process temperature E2 is maintained. In this embodiment, a silicon source gas and an impurity source gas may be supplied together into the chamber at the time T1 when the inside temperature of the chamber reaches the process temperature E2. Silicon nuclei may be formed on the single crystalline silicon layer, and coalescing may occur around the silicon nuclei to form a polycrystalline silicon layer. Accordingly, a conductive layer in which the single crystalline silicon layer and the polycrystalline silicon layer are sequentially stacked over the silicon substrate may be obtained.

Figure 1:
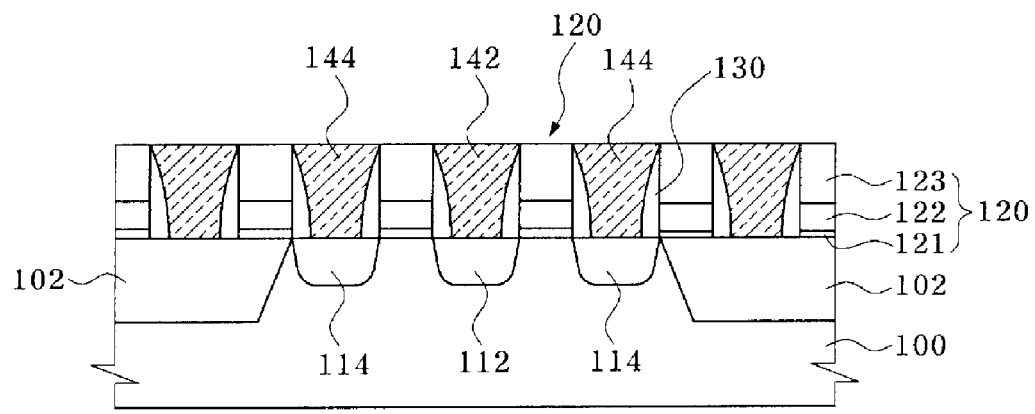
FIG. 1 is a cross-sectional view of landing plug contacts in a semiconductor device.
Figure 2:
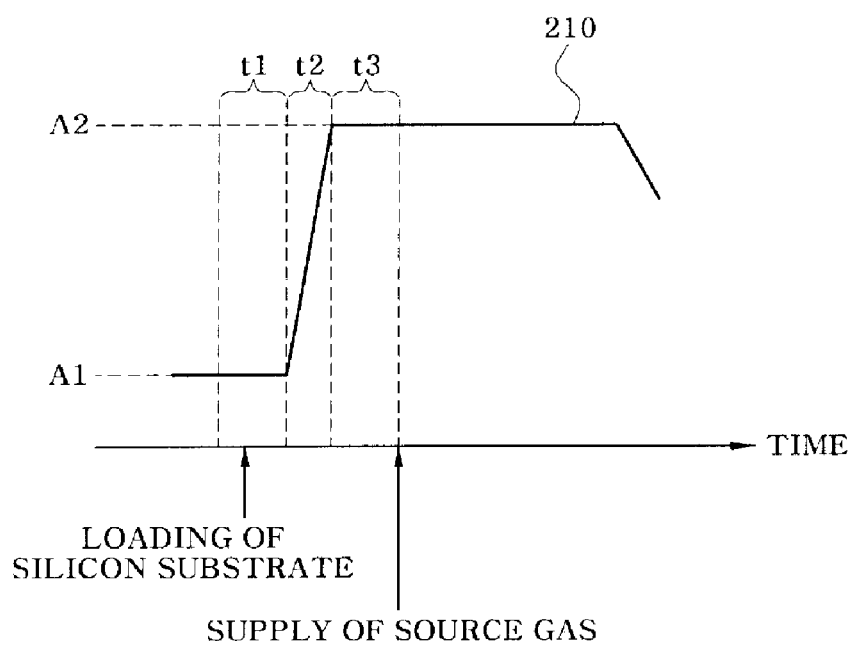
FIG. 2 is a graph of temperature inside a chamber during a LPCVD process of forming a conductive polycrystalline silicon layer.
Figure 7:
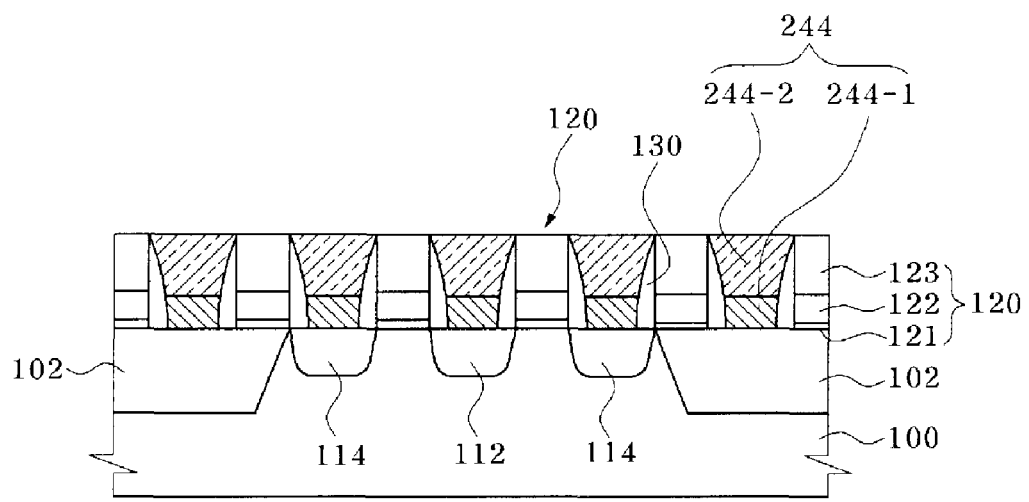
FIG. 7 is a cross-sectional view of a conductive layer which is fabricated according to an embodiment of the present invention.

FIG. 7 is a cross-sectional view of a conductive layer which is fabricated according to an embodiment of the present invention. The conductive layer illustrated in FIG. 7 is a landing plug contact, and like reference numerals refer to like elements in FIGS. 1 and 7. As illustrated in FIG. 7, the landing plug contact 244 has a stacked structure in which a single crystalline silicon layer 244-1 is disposed at a lower portion to contact an impurity region 114 of a silicon substrate 100, and a polycrystalline silicon layer 244-2 is disposed over the single crystalline silicon layer 244-1. As compared with the conventional landing plug contact (144 in FIG. 1) of FIG. 1 which consists of the polycrystalline silicon layer, the stacked structure of FIG. 7 can reduce a total resistance of the landing plug contact 244. The reduced resistance is because the single crystalline silicon layer 244-1 may have lower resistance than a similar layer of polycrystalline silicon. Furthermore, according to an embodiment of the present invention, a conductive layer such as the landing plug contact 244 that has the stacked structure of the single crystalline silicon layer 244-1 and the polycrystalline silicon layer 244-2 can be fabricated using the typical CVD chamber, or chambers for other fabrication processes. Consequently, the operation performance of the semiconductor device can be improved, without increasing fabrication costs.

Figure 8:
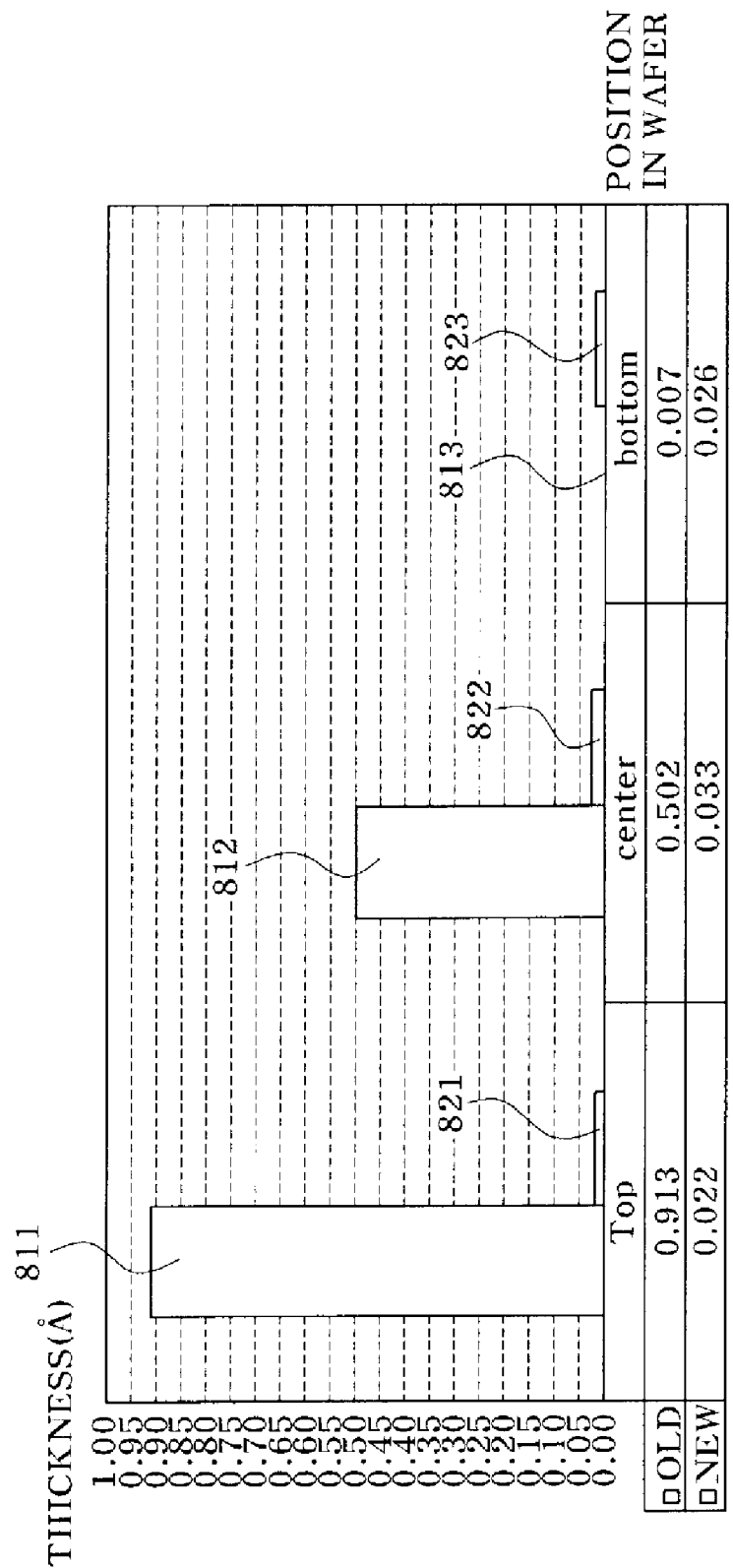
FIG. 8 is a graph showing comparison between the conventional art and an embodiment of the present invention in terms of the thickness of a natural oxide layer formed over the silicon substrate.

FIG. 8 is a graph showing comparison between the conventional art and an embodiment of the present invention in terms of the thickness of the natural oxide layer formed over the silicon substrate. In the conventional art in which the silicon substrate was loaded at the loading temperature of approximately 400° C., the natural oxide layer was formed at the top of the wafer to a thickness of approximately 0.913 Å, as indicated by label 811. The natural oxide layer was formed at the center of the wafer to a thickness of approximately 0.502 Å, as indicated by label 812. The natural oxide layer was formed at the bottom of the wafer to a thickness of approximately 0.007 Å, as indicated by label 813.

On the other hand, in an embodiment of the present invention in which the silicon substrate was loaded at the loading temperature of approximately 250° C. to approximately 300° C., the natural oxide layer was formed at the top, center, and bottom of the wafer to a thickness of 0.022 Å, 0.033 Å, and 0.026 Å, as indicated by labels 821, 822, and 823, respectively. As can be seen from the graph of FIG. 8, the thickness of the natural oxide layer at the top and center of the wafer was significantly reduced. The reduced thickness of the natural oxide layer contributes to the deposition of the single crystalline silicon layer through the supply of the silicon source gas at an appropriate time.

Figure 9:
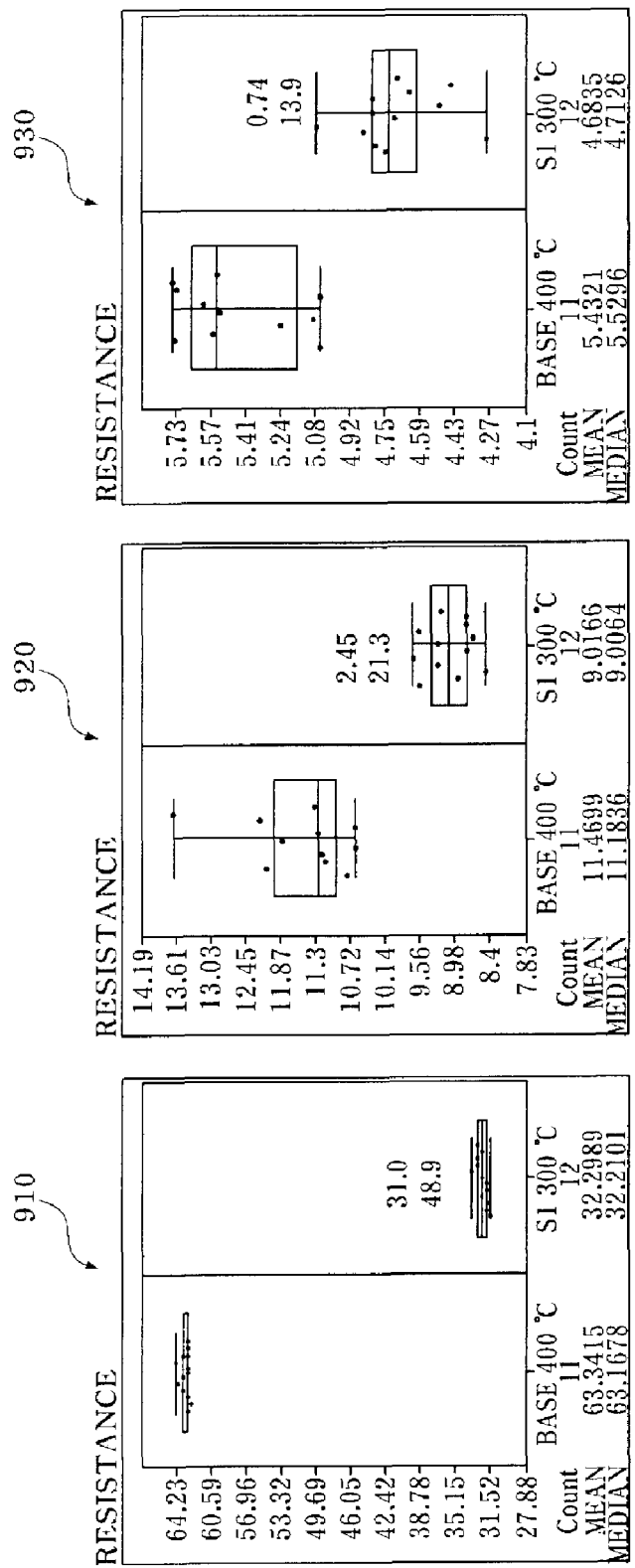
FIG. 9 is a graph showing comparison between the conventional art and an embodiment of the present invention in terms of the resistance of a conductive layer.

FIG. 9 is a graph showing comparison between the conventional art and an embodiment of the present invention in terms of the resistance of a conductive layer. In FIG. 9, a graph indicated by label 910 shows the resistance of the landing plug contact, a graph indicated by label 920 shows the resistance of the storage node contact, and a graph indicated by label shows the resistance of the bit line contact.

In each graph, the left side shows the resistance of the conductive layer consisting of the polycrystalline silicon layer when the silicon substrate was loaded at the loading temperature of 400° C. according to the conventional method. The right side shows the resistance of the conductive layer having the stacked structure including the single crystalline silicon layer and the polycrystalline silicon layer when the silicon substrate was loaded at the loading temperature of 300° C. according to an embodiment of the present invention.

In the case 910 of the landing plug contact, the mean resistance in the conventional art was 63.3415, but the mean resistance in the embodiment of the present invention was 32.289. Thus, it can be seen that the resistance of the landing plug contact was significantly reduced. In the case 920 of the storage node contact, the mean resistance in the conventional art was 11.4699, but the mean resistance in the embodiment of the present invention was 9.0166. Thus, it can be seen that the resistance of the storage node contact was reduced. Likewise, in the case 930 of the bit line contact, the mean resistance in the conventional art was 5.4321, but the mean resistance in the embodiment of the present invention was 4.6835. Thus, it can be seen that the resistance of the bit line contact was reduced.

According to various embodiments of the present invention, the thickness of the natural oxide layer formed on the surface of the silicon substrate during and after the loading procedure can be minimized by loading the silicon substrate into the chamber in such a state that the inside temperature of the chamber is set to be relatively low. Furthermore, the single crystalline silicon layer and the polycrystalline silicon layer are sequentially stacked over the silicon substrate by supplying the silicon source gas and the impurity source gas into the chamber when and before the inside temperature of the chamber reaches the process temperature, thereby reducing the resistance of the conductive layer.

Figure 10:
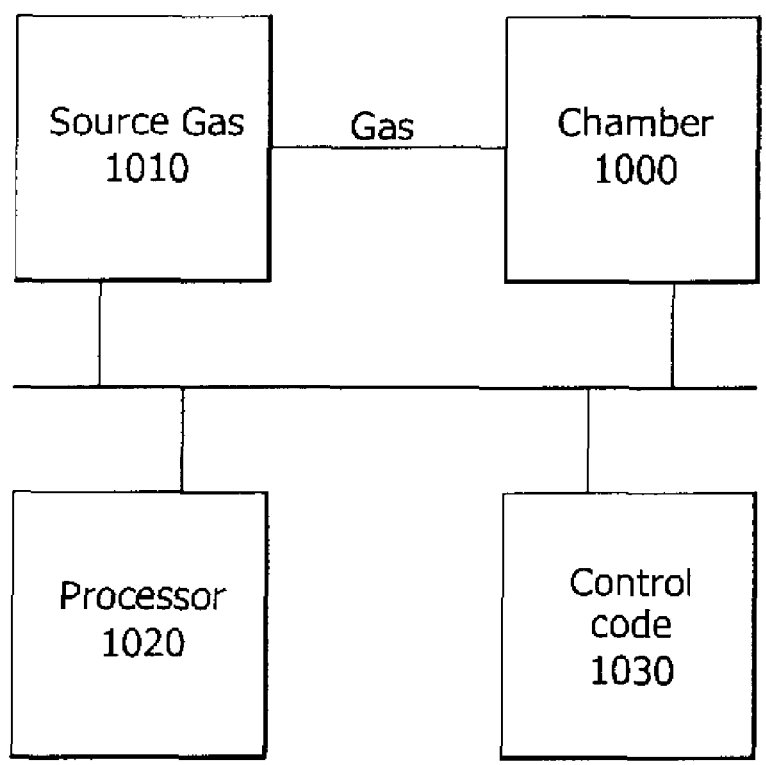
FIG. 10 is a block diagram of an exemplary chamber.

FIG. 10 is a block diagram of an exemplary chamber. Referring to FIG. 10, there is shown a chamber 1000, which may be, for example, a CVD or LPCVD chamber, a source gas container 1010, a processor 1020, and control code 1020. The chamber 1000 may be enabled to receive a substrate, for example, a silicon substrate. The processor 1020 may execute instructions stored in the control code 1030 to control temperature of the chamber 1000 and to supply gases from the source gas container 1010 as described above with respect to various embodiments of the invention.

The source gas container 1010 need not be limited in the manner it stores gases. For example, the source gas container 1010 may store the silicon source gas and the impurity source gas separately, or it may hold the silicon source gas and a mixture of the silicon source gas and the impurity source gas separately.

Additionally, it may be noted that the various components in FIG. 10 have been shown as discrete items, but other configurations may also be used.

Accordingly, the present invention may be embedded in a software program product, which comprises all the features enabling the implementation of the methods described in this application, and, which, when loaded in a machine system such as, for example, a computer, is able to carry out these methods. Software program in the present context means any expression, in any language, code or notation, of a set of instructions intended to cause a system having an information processing capability to perform a particular function either directly or indirectly after one or both of conversion to another language, code or notation, or reproduction in a different material form.

The software program may be stored in a non-transitory tangible machine readable medium. The non-transitory machine readable medium may comprise products such as, for example, semiconductor memory, magnetic tape, paper tape, other serial access devices, and CD/DVD discs, that may be accessed by a machine such as, for example, a computer or a computer peripheral device. This application specifically disclaims the non-transitory machine readable medium as being "signals per se" as described in Director Kappos' memo of January 2010.

The embodiments of the present invention have been disclosed above for illustrative purposes. Those skilled in the art will appreciate that various modifications, additions and substitutions are possible, without departing from the scope and spirit of the invention as disclosed in the accompanying claims.

What is claimed is:

1. A method of fabricating a conductive layer in a semiconductor substrate, the method comprising:
   loading a silicon substrate when a loading temperature inside a chamber is maintained in a range of approximately 250° C. to approximately 300° C.;
   increasing an inside temperature of the chamber from the loading temperature to a process temperature, wherein the process temperature is reached at time T1; and
   sequentially stacking a single crystalline silicon layer and a polycrystalline silicon layer over the silicon substrate by supplying a silicon source gas and an impurity source gas to the chamber at time T1.

2. The method of claim 1, wherein the process temperature is in a range of approximately 500° C. to approximately 550° C.

3. The method of claim 1, where in the chamber is one of CVD chamber and LPCVD chamber.

4. The method of claim 1, wherein the silicon source gas is silane ($SiH_4$).

5. The method of claim 1, wherein the impurity source gas is phosphine ($PH_3$).

6. The method of claim 1, further comprising increasing the inside temperature of the chamber in a substantially linear manner.

7. The method of claim 1, further comprising supplying the silicon source gas and the impurity source gas to the chamber at substantially the same time.

8. A non-transitory machine readable storage having stored thereon, a computer program having at least one code section for controlling fabrication of a semiconductor substrate, the at least one code section being executable by a machine for causing the machine to perform steps comprising:

maintaining a loading temperature inside a chamber in a range of approximately 250° C. to approximately 300° C. after a silicon substrate is loaded in the chamber;

increasing an inside temperature of the chamber from the loading temperature to a process temperature, wherein the process temperature is reached at time T1; and sequentially stacking a single crystalline silicon layer and a polycrystalline silicon layer over the silicon substrate by supplying a silicon source gas and an impurity source gas to the chamber at substantially the same time when the inside temperature of the chamber is the process temperature at time T1.

9. The non-transitory machine readable storage according to claim 8, wherein the process temperature is in a range of approximately 500° C. to approximately 550° C.

10. The non-transitory machine readable storage according to claim 8, where in the chamber is one of CVD chamber and LPCVD chamber.

11. The non-transitory machine readable storage according to claim 8, wherein the silicon source gas is silane ($SiH_4$).

12. The non-transitory machine readable storage according to claim 8, wherein the impurity source gas is phosphine ($PH_3$).

13. The non-transitory machine readable storage according to claim 8, further comprising increasing the inside temperature of the chamber in a substantially linear manner.

14. The non-transitory machine readable storage according to claim 8, further comprising supplying the silicon source gas and the impurity source gas to the chamber at substantially the same time.

* * * * *